(12) United States Patent
Brutschin et al.

(10) Patent No.: US 8,410,462 B2
(45) Date of Patent: Apr. 2, 2013

(54) OPTOELECTRONIC APPARATUS FOR TRANSMISSION OF AN ELECTRICAL SIGNAL

(75) Inventors: Wolfgang Brutschin, Schopfheim (DE); Hartmut Damm, Teningen (DE); Klaus Ruf, Rheinfelden (DE); Alex Zimmermann, Kelbra (DE)

(73) Assignee: Endress + Hasuer GmbH + Co. KG, Maulburg (DE)

( * ) Notice: Subject to any disclaimer, the term of this patent is extended or adjusted under 35 U.S.C. 154(b) by 582 days.

(21) Appl. No.: 12/448,418

(22) PCT Filed: Dec. 6, 2007

(86) PCT No.: PCT/EP2007/063472
§ 371 (c)(1),
(2), (4) Date: Mar. 23, 2010

(87) PCT Pub. No.: WO2008/080759
PCT Pub. Date: Jul. 10, 2008

(65) Prior Publication Data
US 2010/0181506 A1     Jul. 22, 2010

(30) Foreign Application Priority Data
Dec. 29, 2006 (DE) .......................... 10 2006 062 599

(51) Int. Cl.
*H01L 31/167* (2006.01)
(52) U.S. Cl. ............. 250/551; 250/239; 385/27; 385/39

(58) Field of Classification Search .................. 250/551, 250/216, 221; 385/27, 31, 39
See application file for complete search history.

(56) References Cited

U.S. PATENT DOCUMENTS
2010/0086312 A1 *   4/2010  Keita et al. .................... 398/140

FOREIGN PATENT DOCUMENTS
| DE | 3617057 | 11/1987 |
|---|---|---|
| DE | 199 20 403 A1 | 4/2000 |
| EP | 0 568 838 A1 | 11/1993 |
| JP | 06120558 A | 4/1994 |
| WO | WO 2004/048905 A1 | 6/2004 |

* cited by examiner

*Primary Examiner* — Kevin Pyo
(74) *Attorney, Agent, or Firm* — Bacon & Thomas, PLLC

(57) ABSTRACT

An optoelectronic apparatus for transmission of an electrical signal via, galvanically isolated by means of a one-piece, translucent, plastic body, an input current circuit. At least one optical transmission element, and an output current circuit, having at least one optical receiving element, wherein the optical transmission element has a principle transmission axis and the optical receiving element a principle receiving axis, which are oriented so as to concide with a shared optical axis. The plastic body has two cavities separated via a partition for accommodating, respectively, the optical transmission element and the optical receiving element, wherein the transmitting element and/or the receiving element are/is placed through the openings so far into the cavities of the plastic body, that, following a case of overvoltage on the transmitting element and/or the receiving element, an insulating air distance and creep path according to an insulation coordination is still present along outer surfaces of the plastic body.

17 Claims, 2 Drawing Sheets

OPTOELECTRONIC APPARATUS FOR TRANSMISSION OF AN ELECTRICAL SIGNAL

TECHNICAL FIELD

The invention relates to an optoelectronic apparatus for transmission of an electrical signal via, galvanically isolated by means of a one-piece, translucent, plastic body, an input current circuit, having at least one optical transmission element, and an output current circuit, having at least one optical receiving element.

BACKGROUND DISCUSSION

Such optoelectronic apparatuses, having a transmission element, a receiving element and, on occasion, a translucent, plastic body are used, for example, for digital and/or analog signal transmission between two electrical current circuits galvanically isolated from one another.

In industrial measurements technology, especially in automation, and process control, technology, such optoelectronic apparatuses are applied and required in field devices for galvanic isolation of the electrical current circuits for explosion protection. Such field devices ascertain, for example, pressure, flow, fill level, dielectric constant, surface or interface, temperature or some other physical and/or chemical process quantity as the process variable in the conducting of a process. Available from the assignee are, for example, field devices under the marks, CERABAR, DELTABAR, DELTAPILOT, PROMASS, LEVELFLEX, MICROPILOT, PROSONIC, SOLIPHANT, LIQUIPHANT, EASYTEMP, which serve primarily to determine and/or to monitor at least one of the above referenced process variables of a medium in a container.

The galvanic isolation is applied both in the case of so-called two conductor devices, which transmit both the power supply energy and the measurement signal via a single line-pair, as well as also in the case of four conductor devices, which use separate line-pairs, one for transmitting the measuring signal and the other for transmitting the power supply energy. Examples of such field devices using optocouplers for galvanically isolated electrical current circuits are described in U.S. Pat. No. 4,654,771 A and WO 2004/048905 A1.

Optoelectronic apparatuses using optocouplers are described, for example, in DE 199 20 403 A1 and U.S. Pat. No. 6,947,620 B2. In general, such optoelectronic apparatuses are composed of at least one transmission element, e.g. a light emitting diode, and at least one receiving element, e.g. a photodiode or a phototransistor, which are spatially and galvanically isolated from one another via at least one light conducting element.

In order that such optoelectronic apparatuses used for the signal transmission can satisfy the explosion protection required in industrial measurements and automation technology, also required are minimum separations between galvanically isolated, electrical current carrying components, as well as minimum values for air distances, insulation thicknesses and electrical current creep paths. Thus, for example, in the case of a maximum allowable voltage of 250 V, the air distances and the creep path length between galvanically isolated electrical current circuits must be at least 10 mm, or the thickness of solid insulation at least 1 mm. These separations refer, in such case, especially, to the minimum distances between the operationally electrical current carrying connections and conductive traces of the electrical current circuits coupled by means of such optoelectronic apparatuses. Furthermore, there are, for such apparatuses serving as optocouplers, increased requirements also as regards temperature resistance and explosion endangerment risk, as well as also as regards damage scenarios accompanying possibly occurring cases of overloading.

In order, in spite of the high safety requirements, to enable an, as much as possible, high coupling factor, as well as an, as much as possible, compact form of construction of such optoelectronic apparatuses, their light conducting elements are correspondingly embodied to meet the requirements of explosion protection and signal transmission.

SUMMARY OF THE INVENTION

An object of the invention is to provide an optoelectronic apparatus as optocoupler, which is compact, cost-effective and simple to manufacture. Furthermore, the optoelectronic apparatus should provide a high coupling factor, while fulfilling mechanical requirements and the required explosion protection requirements.

The object of the invention is achieved by an input current circuit, having at least one optical transmission element; and an output current circuit, having at least one optical receiving element, wherein: said optical transmission element has a principle transmission axis of maximum transmission intensity and the optical receiving element a principle receiving axis of maximum receiving intensity; the principle transmission axis of said optical transmission element and the principle receiving axis of said optical receiving element coincide with a shared optical axis; said plastic body has two cavities separated via a partition for accommodating, respectively, said optical transmission element and said optical receiving element; openings of said two cavities in said plastic body lie on the optical axis; and said transmitting element and/or said receiving element are/is placed through said openings so far into said cavities of said plastic body, that, following a case of overvoltage on said transmitting element and/or said receiving element, an insulating air distance and creep path according to an insulation coordination is still present along the outer surfaces of said plastic body.

The aforementioned, as well as claimed, components, and components described in the examples of embodiments, as used according to the invention, are subject to no special conditions as regards their size, shape, formation, materials and technical designs, so that selection criteria known in the field of application can be used without limitation.

BRIEF DESCRIPTION OF THE DRAWINGS

Other details, features and advantages of the subject matter of the invention will become apparent from the subsequent description of the associated drawings, in which preferred examples of embodiments of the invention are presented. In the examples of embodiments of the invention shown in the figures, in order to avoid clutter and for simplification, components or assemblies of components, which correspond in construction and/or in function, are provided with equal reference characters. The figures of the drawings show as follows.

DETAILED DISCUSSION IN CONJUNCTION WITH THE DRAWINGS

Figure 1:
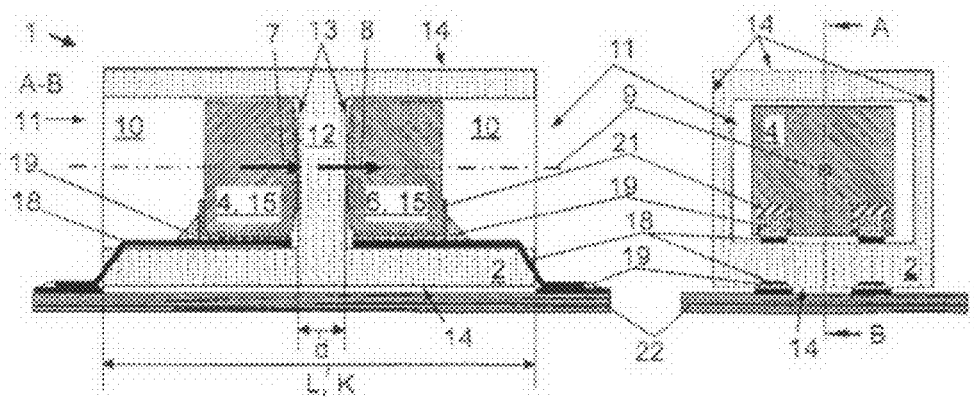
FIG. 1 a first example of an embodiment of the optoelectronic apparatus of the invention, FIG. 2 a second example of an embodiment of the optoelectronic apparatus of the invention, FIG. 3 a third example of an embodiment of the optoelectronic apparatus of the invention, FIG. 4 a first example of application of the optoelectronic apparatus of the invention as optocoupler.

FIG. 1 shows a first example of an embodiment of the optoelectronic apparatus 1 of the invention for transmission of an electrical signal S, on the right as side view and on the left as sectional view according to the cutting plane A-B of the side view. This optoelectronic apparatus 1 can, for example, be applied for galvanic isolation of an input electrical current circuit 3 from an output electrical current circuit 5. The optoelectronic apparatus 1 is composed essentially of a one-piece, translucent, plastic body 2, in which, galvanically isolated via a partition 12, an optical transmitting element 4 in the input current circuit 3 and an optical receiving element 6 in the output current circuit 5 are placed. For this, two, oppositely lying cavities 10 separated via the partition 12 are formed in the plastic body 2. Via the openings 11 of the cavities 10, the optical transmitting element 4 and the optical receiving element 6 can be emplaced in the plastic body 2. Electrical contacting occurs via connecting conductors 18, which are connected via solder connections 19 at contact surfaces 21 on the optical transmitting element 4 and optical receiving element 6. The connecting conductors 18 are led out of the cavities 10 to the conductive trace connections on the circuit board 22 and electrically conductingly connected via solder connections 19. The creep path length L between the connection conductors 18 on the circuit board 22 or on the outer surface 14 of the plastic body 2 is greater than ten millimeter. Thus, there results a base length K of the plastic body 2 of somewhat more than ten millimeters, e.g. eleven millimeter, whereby the electrical requirements for the optoelectronic apparatus 1 according to German Industrial Standard EN 50020 are met.

Orientation of the transmission element 4 and the receiving element 6 occurs via the cavities 10 in the plastic body 2. For example, the cavities 10 slightly conically narrow toward the faces 13 of the partition. In this way, for example, the principle transmission axis 7 of the transmission element 4 coincides with the principle receiving axis 8 of the receiving element 6 along the optical axis 9.

Figure 3:
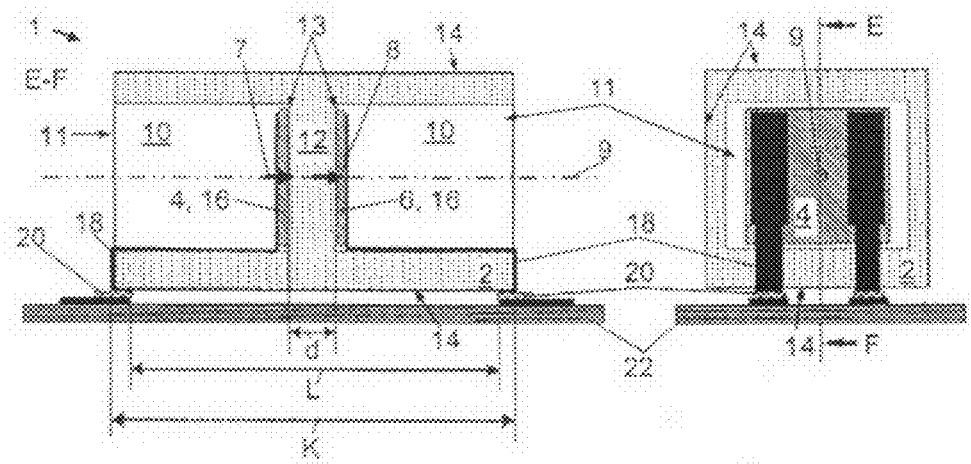

The transmitting element 4 and the receiving element 6 are constructed in this embodiment as surface mountable components 15, with mounting being on their lateral edges. However, an application of discrete components or, such as shown in FIG. 3, of thin film components 16 of an organic, semiconducting material are other options for examples of embodiments of the invention.

The faces 13 of the partition 12 are, for example, polished, whereby an increased direct current, transfer ratio, of about 240, is reached. The direct current, transfer ratio (CTR=Current Transfer Ratio) states for optocouplers the ratio between the input signal current to the output signal current. In the case of optocouplers having a photodiode as receiving element 6, the direct current, transfer ratio lies in the range of 0.001-0.005 of the input electrical current, while in the case of optocouplers having a photo transistor as receiving element 6, the range is 10-10000. The partition has a thickness d of at least one millimeter.

A great advantage of this embodiment of the plastic body 2 of the invention is that, even after an explosion of the transmission element 4 or of the receiving element 6 due to a supplying of the components with a high voltage, e.g. 250 volt, no creep path can occur over the outer surfaces 14 of the plastic body 2 or the circuit board 22. The arising metal vapors are, due to the embodiments of the cavities 10 of the invention, expelled from the openings 11 in different directions, so that no metal fog can deposit. Furthermore, the pressure wave of an exploding transmission element 4 or receiving element 6 directed toward the openings 11 in the plastic body 2 has scarcely any mechanical effect on the plastic body 2 itself, so that it is not destroyed. Therefore, even a thickness d of the partition 12 of a millimeter can be sufficient to resist the possibly arising, pressure wave. Since short circuit resistance is also assured after an explosion of the components, the placing of fuses before the transmission element 4 or the receiving element 6 for limiting power uptake can be omitted, which leads to a considerable space saving on the circuit board 22.

Figure 2:
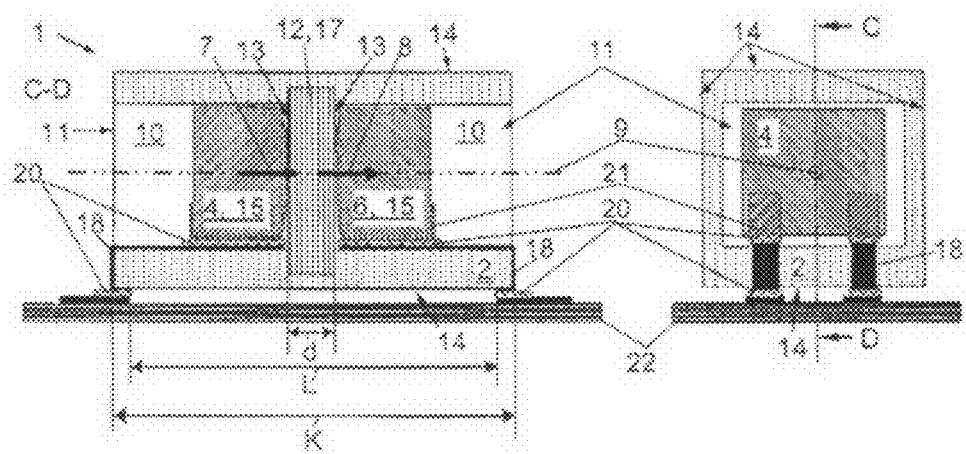

FIG. 2 shows a second example of an embodiment of the optoelectronic apparatus 1 of the invention for transmission of an electrical signal S, on the right as side view and on the left as sectional view according to the cutting-plane C-D of the side view. In contrast to the first example of an embodiment in FIG. 1, here in the plastic body 2, the partition 12 is embodied as an optical filter 17. For this, for example, a filter element is present during, and locked in place by, the injection molding manufacture of the plastic body 2. This optical filter 17 has the function of passing only the wavelength, e.g. infrared light, of the transmission element 4, while background light irradiation is blocked. The optical filter 17 can, for example, be embodied as an interference filter, in the form of a high quality, optical filter, having a narrow transmissive range and a high degree of suppression in the blocking region. This optical filter 17 can also be embodied by application of a filter film to the faces 13 of the partition 12 or directly on the transmission element 4, or receiving element 6.

Furthermore, FIG. 2 shows another method of contacting the transmission element 4 and the receiving element 6. For this, the plastic body 2 was partially coated with a metal or thin metal layers were applied as connecting conductor 18 on the surface of the plastic body 2 in the cavities 10. The connecting conductors 18 are led a segmental width on the outer surface 14, so that they can be connected with conductive traces on the circuit board 22.

Another type of manufacture of connection conductors is provided by MID technology (Moulded Interconnected Devices). In such case, either a core-catalytically filled, metallizable plastic is so modified in ascertained regions by a laser, that, partially, a metal layer can be galvanically deposited or, in the case of a large-surface, metallized, plastic body 2, a laser is used to partially vaporize the metal layer and, thus, to form the connecting conductor 18.

The electrical connection between the connection conductors 18 and contact surface 21 of the transmission element 4, or receiving element 6, as well as to the conductive traces, occurs by means of an electrical, adhesive connection 20.

FIG. 3 shows a third example of an embodiment of the optoelectronic apparatus 1 of the invention for transmission of an electrical signal S, on the right as side view and on the left as sectional view according to the cutting plane E-F of the side view. In this example of an embodiment, two thin-film components 16 of an organic, semiconducting material are adhered directly to the faces 13 of the partition 12 by means of an optical adhesive. Advantage of this example of an embodiment lies in the fact that the connecting conductor 18 can be adhered with large area of contact on the rear of the thin-film, transmission element 4 or receiving element 6 by means of an electrically conductive, adhesive connection 20, whereby a simple mounting of the optoelectronic element 1 is provided.

Figure 4:
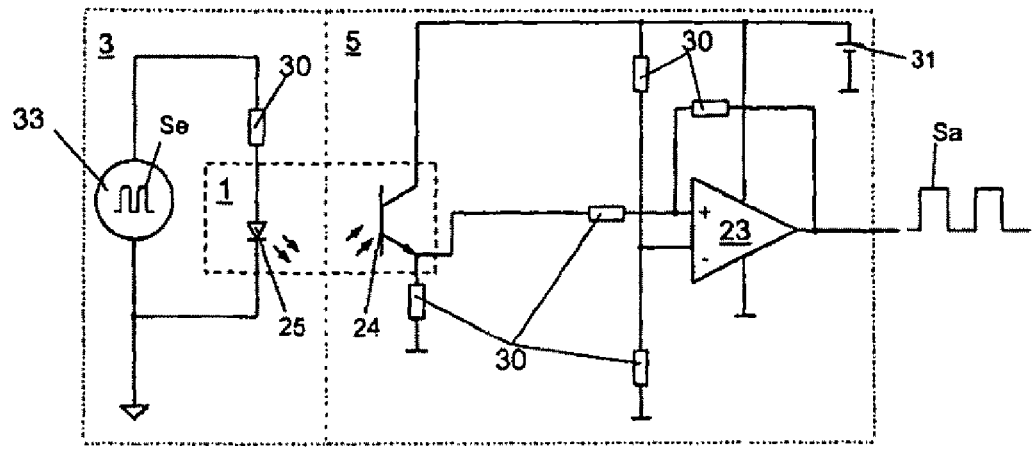

FIG. 4 shows a first example of application of the optoelectronic apparatus 1 of the invention as optocoupler for transmission of an alternating voltage signal. The input current circuit 3 comprises a signal generator 33, which feeds, limited via a resistor 30, a light emitting diode 25 as transmission element 4. Light-emitting diode 25 sends, corresponding to the signal of the signal generator, a light signal to the receiving element 6 in the output current circuit 5. The output current circuit 5 comprises a phototransistor 24 as receiving element 6, whose output signal is amplified by a non-inverting, operational amplifier circuit. The non-inverting, operational amplifier circuit is composed of an operational amplifier 23 and a number of resistors 30 for setting the amplification.

Figure 5:
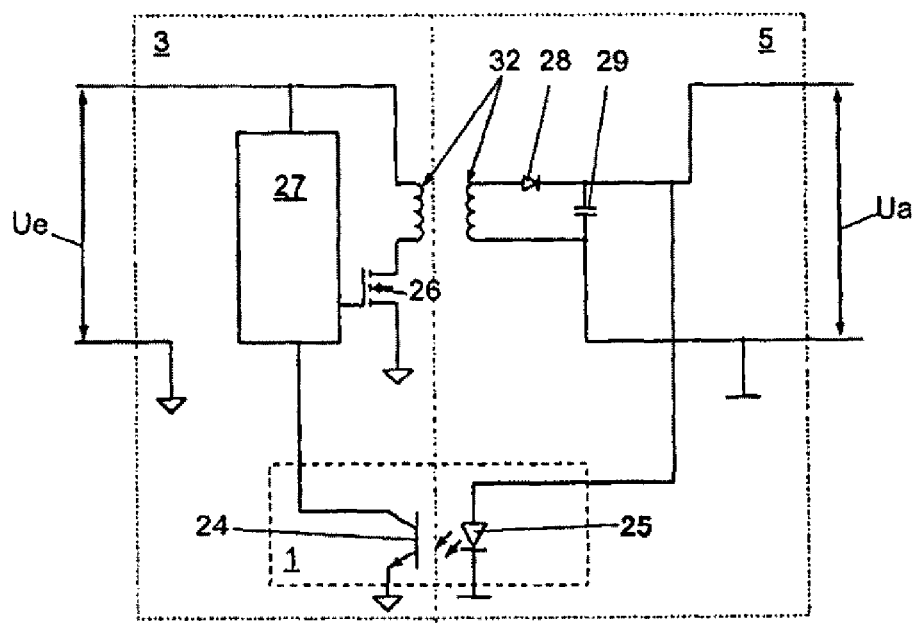
FIG. 5 a second example of application of the optoelectronic apparatus of the invention.

FIG. 5 shows a second example of application of the optoelectronic apparatus of the invention as optocoupler for transmitting the control signal of an AC/DC-converter or DC/DC-converter. The input current circuit 3 comprises a control (open, or closed, loop control) unit 27, a field effect transistor 26 and a first winding of a transformer 21. The output current circuit comprises a capacitor 29 and a diode 28. The optoelectronic apparatus measures in the output current circuit 5 the output voltage Uo, in that this voltage lies across the light emitting diode 25, so that the light emitting diode 25 glows in proportion to the output voltage Uo. The phototransistor 24 as receiving element 6 operates in accordance with the light signal. The control unit 27 measures the current from the phototransistor 24 and controls via the field effect transistor 26 the energy induced in the transformer 21 for the input voltage Ui.

The invention claimed is:

1. An optoelectronic apparatus for transmission of an electrical signal via, galvanically isolated by means of a one-piece, translucent, plastic body, comprising:
   an input current circuit, having at least one optical transmission element; and
   an output current circuit, having at least one optical receiving element, wherein:
   said optical transmission element has a principle transmission axis of maximum transmission intensity and the optical receiving element has a principle receiving axis of maximum receiving intensity;
   the principle transmission axis of said optical transmission element and the principle receiving axis of said optical receiving element coincide with a shared optical axis;
   said plastic body has two cavities separated via a partition for accommodating, respectively, said optical transmission element and said optical receiving element;
   openings of said two cavities in said plastic body lie on the optical axis; and
   said transmitting element and/or said receiving element are/is placed through said openings so far into said cavities of said plastic body, that, following a case of overvoltage on said transmitting element and/or said receiving element, an insulating air distance and creep path of said plastic body related to a mounting on a circuit board is still present along the outer surfaces of said plastic body.

2. The optoelectronic apparatus as claimed in claim 1, wherein:
   said transmitting element and/or said receiving element are/is placed through said openings in said cavities of said plastic body in such a manner that, in the case of an overvoltage on said transmitting element and/or said receiving element, a pressure equalization occurs via said openings of said cavities.

3. The optoelectronic apparatus as claimed in claim 1, wherein:
   said plastic body has a rectangular geometry, with a base length of at least ten millimeter along the optical axis.

4. The optoelectronic apparatus as claimed in claim 1, wherein:
   said partition has a thickness of at least one millimeter.

5. The optoelectronic apparatus as claimed in claim 1, wherein:
   said optical transmission element arid/or said optical receiving element are/is embodied as surface mountable component(s) for mounting on lateral edges thereof.

6. The optoelectronic optoelectronic apparatus as claimed in claim 1, wherein:
   said optical transmission element and/or said optical receiving element are/is embodied as discrete component(s).

7. The optoelectronic apparatus as claimed in claim 1, wherein:
   said optical transmission element and/or said optical receiving element are/is embodied as thin film component(s) of organic, semiconducting material.

8. The optoelectronic apparatus as claimed in claim 1, wherein:
   said optical transmission element and/or said optical receiving element are/is embodied without a limiting element for power uptake.

9. The optoelectronic apparatus as claimed in claim 1, wherein:
   said cavities have a rectangular geometry conically extending from said openings to the faces of said partition.

10. The optoelectronic apparatus as claimed in claim 1, wherein:
    said outer surfaces of said plastic body are roughened, structured, lacquered and/or coated.

11. The optoelectronic apparatus as claimed in claim 1, wherein:
    said partition is embodied as an optical filter.

12. The optoelectronic apparatus as claimed in claim 1, wherein:
    said faces of said partition are optically polished.

13. The optoelectronic apparatus as claimed in claim 1, wherein:
    said plastic body is produced as an injection molded part.

14. The optoelectronic apparatus as claimed in claim 13, wherein:
    metal connecting conductors for contacting said optical transmission element and said optical receiving element are emplaced directly in the injection molding of said plastic body.

15. The optoelectronic apparatus as claimed in claim 13, wherein:
    regions of a conductive synthetic material are emplaced as connecting conductor directly in the injection molding of said plastic body.

16. The optoelectronic apparatus as claimed in claim 13, wherein:
    said optical transmission element and/or said optical receiving element are emplaced directly in the injection molding of said plastic body.

17. The use of the apparatus as claimed in claim 1 as an optocoupler between galvanically isolated, electrical current circuits of a field device of process automation technology.

* * * * *